United States Patent
Poteet et al.

(10) Patent No.: US 11,378,450 B2
(45) Date of Patent: Jul. 5, 2022

(54) COMPACT INFRARED SPECTROMETER SYSTEMS AND METHODS FOR MEASURING VIBRATIONAL SPECTRUM OF MATERIALS AND SUBSTANCES

(71) Applicant: Lightsense Technology, Inc., Tucson, AZ (US)

(72) Inventors: Wade Martin Poteet, Vail, AZ (US); Terje A. Skotheim, Tucson, AZ (US)

(73) Assignee: LIGHTSENSE TECHNOLOGY, INC., Tucson, AZ (US)

( * ) Notice: Subject to any disclaimer, the term of this patent is extended or adjusted under 35 U.S.C. 154(b) by 33 days.

(21) Appl. No.: 16/713,398

(22) Filed: Dec. 13, 2019

(65) Prior Publication Data

US 2020/0191651 A1 Jun. 18, 2020

Related U.S. Application Data

(60) Provisional application No. 62/779,066, filed on Dec. 13, 2018.

(51) Int. Cl.
*G01J 3/10* (2006.01)
*G01N 21/35* (2014.01)
(Continued)

(52) U.S. Cl.
CPC ............. *G01J 3/108* (2013.01); *G01J 3/0272* (2013.01); *G01J 3/18* (2013.01); *G01J 3/4338* (2013.01);
(Continued)

(58) Field of Classification Search
CPC .. G01J 3/108; G01J 3/18; G01J 3/0272; G01J 3/4338; G01J 3/06; G01J 2003/2879; G01J 2003/425; G01N 21/35; G01N 21/552

See application file for complete search history.

(56) References Cited

U.S. PATENT DOCUMENTS 6,229,614 B1 5/2001 Larsen
8,022,366 B2 9/2011 Hartley
(Continued)

FOREIGN PATENT DOCUMENTS

WO 2015110780 A1 7/2015

OTHER PUBLICATIONS

Wikipedia, "Diffraction efficiency," Mar. 13, 2020, 2 pages, Retrieved from the Internet on Aug. 26, 2021 at URL: en.wikipedia.org/wiki/Diffraction_efficiency.
(Continued)

*Primary Examiner* — David P Porta
*Assistant Examiner* — Mamadou Faye
(74) *Attorney, Agent, or Firm* — Jaffery Watson Mendonsa & Hamilton LLP (57) ABSTRACT

Systems and methods for measuring a fundamental mode vibrational spectrum of materials and substances in the Mid-IR spectral range of 2.5 µm to 14 µm wavelength. are disclosed herein. In one embodiment, a Mid-infrared absorption spectrometer (MIRAS) system includes an infrared Micro-Electro-Mechanical System (MEMS) single element emitter light source. The light source is electrically pulsed and emits electromagnetic radiation in the wavelength range from 2.5 µm to 14 µm and has an integral energy concentrating optic to provide energy for a spectral absorption process. The system includes a scanning high-efficiency infrared spectral grating with self-calibrating feature, configured so that incident energy having absorption information for the spectral absorption process of a sample is within a predefined threshold of a grating blaze angle. The system also includes a single-element thermal detector to receive output energy having the absorption information from the infrared spectral grating.

19 Claims, 4 Drawing Sheets

(51) Int. Cl.

| | |
|---|---|
| *G01J 3/18* | (2006.01) |
| *G01J 3/02* | (2006.01) |
| *G01J 3/433* | (2006.01) |
| *G01J 3/28* | (2006.01) |
| *G01J 3/42* | (2006.01) |
| *G01J 3/06* | (2006.01) |

(52) U.S. Cl.
CPC .......... *G01N 21/35* (2013.01); *B81B 2201/04* (2013.01); *G01J 2003/069* (2013.01); *G01J 2003/2879* (2013.01); *G01J 2003/425* (2013.01)

(56) References Cited

U.S. PATENT DOCUMENTS

| | | | |
|---|---|---|---|
| 8,344,323 | B1 | 1/2013 | Hartley |
| 9,568,365 | B2 | 2/2017 | Giebeler et al. |
| 2001/0046047 | A1* | 11/2001 | Ryer .................. G01J 3/0291 356/328 |
| 2016/0146722 | A1 | 5/2016 | Koerner et al. |
| 2018/0172517 | A1* | 6/2018 | Grueger ............... G01J 3/0218 |
| 2019/0137520 | A1* | 5/2019 | Burd ..................... G01N 33/70 |
| 2020/0141866 | A1 | 5/2020 | Gerwert |

OTHER PUBLICATIONS

B&W Tek, "An Introduction to a Spectrometer—Spectral Resolution," Dec. 2, 2016, 5 pages, Retrieved from the Internet on Aug. 26, 2021 at URL: azom com/article aspx?ArticleID=13369.

ASPECTUS GmbH, "Mid-Infrared Spectroscopy," 2021, 2 pages, Retrieved from the Internet on Apr. 21, 2021 at URL https://aspectus-gmbh.com/mid-infrared-spectroscopy.html#:~:text=The%20IR%20Sphinx%20products%20are,or% 20of%205.5-11.0%20µm.

AZO Materials, "FluidScan Q1200: Portable Marine Base No. Analyzer," 2021, 5 pages, Retrieved from the Internet on Apr. 21, 2021 at URL: azom.com/equipment-details.aspx?EquipID=4231.

Brian C. Smith, "Fundamentals of Fourier Transform Infrared Spectroscopy: Chapter 2: How an FTIR Works," 2011, pp. 19-53, Second Edition, CRC Press, Taylor and Francis Group, LLC.

D. Haaland and E. Thomas, "Partial Least-Squares Methods for Spectral Analyses. 1. Relation to Other Quantitative Calibration Methods and the Extraction of Qualitative Information," American Chemical Society, 1988, pp. 1193-1202.

G. Lawson et al., "Counterfeit Tablet Investigations: Can ATR FT/IR Provide Rapid Targeted Quantitative Analyses?," Journal of Analytical & Bioanalytical Techniques, 2014, 6 pages, vol. 5, Issue 5.

H. Schumacher et al., "Applications of Microstructured Silicon Wafers as Internal Reflection Elements in Attenuated Total Reflection Fourier Transform Infrared Spectroscopy," Applied Spectroscopy, 2010, pp. 1022-1027, vol. 64, No. 9.

K. Degardin and Y. Roggo, "Innovative Strategy for Counterfeit Analysis," Med Access @ Point Care, 2017, pp. 55-71.

Le Rodriguez-Saona and ME Allendorf, "Use of FTIR for Rapid Authentication and Detection of Adulteration of Food," Review of Food Science and Technology, 2011, Abstract, 1 page.

P. Griffiths and J. De Haseth, "Fourier transform Infrared Spectrometry: Chapter 1: Introduction to Vibrational Spectroscopy," 2007, 18 pages, John Wiley & Sons, Inc.

P. Lewis et al., "Evaluation of FTIR Spectroscopy as a Diagnostic Tool for Lung Cancer using Sputum," BMC Cancer, 2010, 10 pages, Retrieved from the Internet on Nov. 29, 2021 at URL—/bmccancer.biomedcentral.com/track/3df/10.1186/1471-2407-10-640.pdf.

R. Arasaradnam et al., "Noninvasive Diagnosis of Pancreatic Cancer Through Detection of Volatile Organic Compounds in Urine," Gastroenterology in Motion, 2018, pp. 485-487.e1, Retrieved from the Internet on Nov. 29, 2021 at URL—gastrojournal.org/article/S0016-5085(17)36347-3/abstract.

R. Henn et al., "Hemodialysis Monitoring Using Mid- and Near-Infrared Spectroscopy with Partial Least Squares Regression," Journal of Biophotonics, Feb. 26, 2018, 18 pages, Retrieved from Internet on Nov. 29, 2021 at URL—onlinelibrary.wiley.com/doi/10.1002/jbio.201700365.

R. Ortiz et al., "Counterfeit Cialis and Viagra Fingerprinting by ATR-FTIR Spectroscopy with Chemometry: Can the same Pharmaceutical Powder Mixture be used to Falsify Two Medicines?," Forensic Science International, Mar. 2013, Abstract, pp. 1-3, Elsevier B.V.

S. De Bruyne et al., "Applications of Mid-Infrared Spectroscopy in the Clinical Laboratory Setting," Critical Reviews n Clinical Laboratory Sciences, 2018, 21 pages, vol. 55, No. 1, Taylor & Francis.

Selectscience, "The Ocean MZ5 Miniature Spectrometer for MIR Analysis," Jan. 3, 2019, 3 pages, Retrieved from the Internet on Apr. 21, 2021 at URL: selectscience.net/SelectScience-TV/Videos/the-ocean-mz5-miniature-spectrometer-for-mir-analysis/?videoID=4472.

Thermo Fisher Scientific, "Portable Analysis for Material ID," 2021, 3 pages, Retrieved from the Internet on Apr. 21, 2021 at URL: thermofisher.com/us/en/home/industrial/spectroscopy-elemental-isotope-analysis/portable-analysis-material-id.html.

\* cited by examiner

FIG. 4

COMPACT INFRARED SPECTROMETER SYSTEMS AND METHODS FOR MEASURING VIBRATIONAL SPECTRUM OF MATERIALS AND SUBSTANCES

RELATED APPLICATIONS

This application claims the priority of U.S. Provisional Application No. 62/779,066, filed Dec. 13, 2018, the contents of which are incorporated by reference herein.

FIELD

Embodiments of the invention pertain to systems and methods for measuring a fundamental mode vibrational spectrum of materials and substances in the Mid-IR spectral range of 2.5 µm to 14 µm wavelength.

BACKGROUND

Absorption spectroscopy refers to spectroscopic techniques that measure the absorption of radiation, as a function of frequency or wavelength, due to its interaction with a sample. The sample absorbs energy, i.e., photons, from the radiating field. The intensity of the absorption varies as a function of frequency, and this variation is the absorption spectrum. Absorption spectroscopy is employed as an analytical chemistry tool to determine the presence of a particular substance in a sample and, in many cases, to quantify the amount of the substance present. Infrared and ultraviolet-visible spectroscopy are particularly common in analytical applications. There are a wide range of experimental approaches for measuring absorption spectra. The most common arrangement is to direct a generated beam of radiation at a sample and detect the intensity of the radiation that passes through it. The transmitted energy can be used to calculate the absorption. The source, sample arrangement and detection technique vary significantly depending on the frequency range and the purpose of the experiment.

A prior method used for mid-infrared substance measurements is the laboratory FT-IR spectrometer. A sample is placed onto a sampling membrane, dried, and then mounted with some amount of pressure against a crystal in the spectrometer's light path for analysis. Spectral resolution of these instruments is adjustable from less than 1 cm$^{-1}$ to about 30 cm$^{-1}$. Cost for these instruments of $20,000-$90,000 is high and prohibitive for most small laboratories and not at all practical for applications in which small size, robustness, and low cost is necessary. These applications include point-of-care instruments for individual medical patient applications; chemical and materials analysis in the field; in-line and real-time industrial process control; and consumer applications such as measuring the ripeness of food or adulteration of drugs.

Various mid-IR instruments have been recently introduced to the market and these instruments utilize linear variable spectral filters [LVF] atop a detector array with a variety of energy sources, depending on the wavelength being measured. These instruments cover only a limited spectral range for a single LVF and are costly to produce, selling for $10,000 or more at this time. These instruments may be relatively small though.

SUMMARY

For one embodiment of the present invention, systems and methods for measuring the fundamental mode vibrational spectrum of materials and substances in the spectral range of 2.5 µm to 14 µm wavelength are disclosed herein. In one example, a Mid-infrared absorption spectrometer (MIRAS) system includes an infrared Micro-Electro-Mechanical System (MEMS) single element emitter light source. The light source is electrically pulsed and emits electromagnetic radiation in the wavelength range from 2.5 µm to 14 µm and has an integral energy concentrating optic to provide energy for a spectral absorption process. The system includes a scanning high-efficiency infrared spectral grating with self-calibrating feature, configured so that incident energy having absorption information for the spectral absorption process of a sample is within a predefined threshold of a grating blaze angle. The system also includes a single-element thermal detector to receive output energy having the absorption information from the infrared spectral grating.

Other features and advantages of embodiments of the present invention will be apparent from the accompanying drawings and from the detailed description that follows below.

BRIEF DESCRIPTION OF THE DRAWINGS

Embodiments of the present invention are illustrated by way of example and not limitation in the figures of the accompanying drawings, in which like references indicate similar elements, and in which.

DETAILED DESCRIPTION

Systems and methods for measuring the fundamental mode vibrational spectrum of materials and substances in the spectral range of 2.5 µm to 14 µm wavelength are disclosed herein.

Embodiments of the present invention include a spectrometer system that is sufficiently small to be used as a handheld device. This spectrometer system is capable of resolution as low as 12 cm−1, which is 3× better than current LVF instruments, possesses the sensitivity of a typical FT-IR instrument and surpasses the sensitivity of the currently available LVF instruments by 3×. Further, the estimated manufacturing cost per unit in modest quantity (>500 units) is less than $200, making it affordable for almost any critical laboratory or medical patient application as well as process control and a range of consumer applications for which current instruments are too expensive. With larger volumes, the manufacturing cost drops below $100.

Compared to conventional linear variable filter +detector array designs, the present design lowers the manufacturing cost by more than 10 times; provides 3 times better resolution; and provides 2 times better sensitivity because of optimized optical design and high-efficiency spectral grating.

Scanning grating absorption spectrometers have been designed for larger dimension instruments, described, and utilized in the laboratory for some time, but none have used the micro-machined attenuated total reflection (ATR) silicon crystal and enhanced ATR design of this present design and none have used the high-brightness MEMS (Micro-Electro-Mechanical Systems) infrared emitters (e.g., single element emitter light sources). The optimized scanning grating configuration is also unique to embodiments of this invention. This innovation makes measurements in the Mid-IR wavelength range very affordable, even for point-of-care medical use by patients as well as oil, gas, and industrial chemical applications. The present design makes general scientific laboratory use economically feasible on a large scale for laboratories with limited funding.

Conventional designs and offerings are so costly, that less precise and fewer effective instruments are used to detect medical issues with patients. Oil and gas processing are monitored using imprecise calculations inferred from thermometers, for example, or else in central laboratories at considerable cost and time leg. Industrial chemical manufacturers often use a single expensive spectrometer shared with other nearby processing facilities to partially monitor critical parameters, resulting in inefficient manufacturing. Prior to this spectrometer system of the present design, the possibility to implement in-line, real-time spectroscopic monitoring of, for example, industrial processes was not possible. Similarly, with conventional spectrometers there was no opportunity to develop consumer applications such as for measuring food quality and safety.

Embodiments of the present invention relate generally to the field of substance and material detection using a novel, compact, inexpensive mid-infrared [MIR] spectrometer configured to measure the fundamental mode vibrational spectrum of those materials and substances in the spectral range 2.5 µm to 14 µm wavelength [715 $cm^{-1}$-4000 $cm^{-1}$]. Both identification and quantification from single and multiple-substance mixtures can result from these measurements. More specifically, embodiments of the present invention relate to these mid-infrared measurements using the described optimized scanning-grating absorption spectrometer with either an Attenuated Total Reflection (ATR) silicon crystal, an enhanced ATR silicon crystal, utilized for the sample application, or a more standard transmission cell or flow cell with reflective surface arrangement. The particular novel combination of components does not currently exist in the literature or in any product; thus, the system is unique, and the implementation provides a compact, inexpensive solution for sensitive MIR measurements.

The particular arrangement of components of the present design takes advantage of optimized incident and reflection angles of components, such as the grating, where the average angle of incidence is designed to be at the grating blaze angle, thus maximizing its spectral efficiency. The use of a micro-machined silicon ATR in this configuration is unique and provides enhanced efficiency for absorption measurements. Additionally, the ATR can be an inexpensive disposable, which is especially desirable for medical applications where the substance being measured is biologically hazardous (e.g., sputum from COPD patients where lung diseases are being measured). The MEMS IR light source provide a broader spectrum IR light at higher intensity than other sources. The compact nature of the design presented in this present design allows small, low-power, handheld devices in any application requiring a measurement of the spectrum in the spectral range of 2.5 µm to 14 µm.

The present design is functionally unique due to being flexible with regard to device orientation with respect to gravity and can be quickly changed from a reflection spectrum to an absorption spectrum or flow-cell measuring device.

Figure 1:
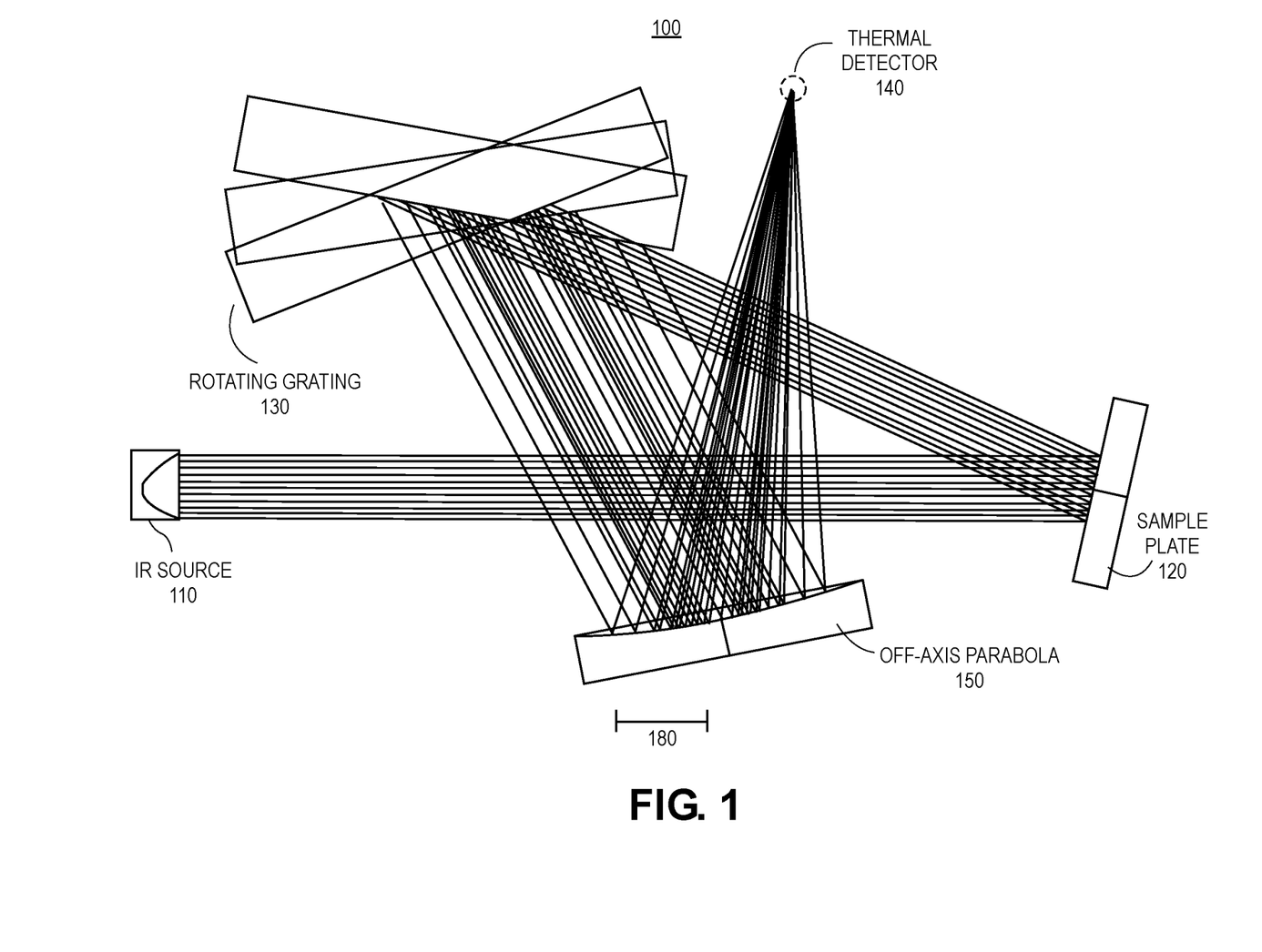
FIG. 1 illustrates an exemplar spectrometer system in accordance with one embodiment.

FIG. 1 illustrates an exemplar spectrometer system (e.g., handheld spectrometer device) in accordance with one embodiment. This exemplar system 100 (e.g., handheld spectrometer device 100) includes an energy source 110 and a potentially disposable sample plate 120 (e.g., silicon ATR crystal plate 120, enhanced silicon ATR crystal plate) in the optical beam for sampling, or alternatively a transmission cell, or flow cell with a reflective surface arrangement. The system 100 also includes an optimized high-efficiency miniature scanning diffraction grating 130 for this application and a thermal detector 140 for low cost and required resolution. In one example, a unit 180 has a scale of 5 mm for the handheld device 100.

The energy source 110 may be a collimated high-brightness MEMS IR emitter energy source 110 (e.g., single emitter energy source) that has been developed for a range of applications, including gas sensors and commercial spectrometers. These emitters produce IR quasi-blackbody emission by thermoresistive heating of a thin (e.g., 1.0 µm-2.0 µm thickness) free-hanging membrane which is suspended above a Silicon substrate frame. Currently commercially available MEMS sources operate at temperatures up to 600° C., while the energy sources of the present design can operate at temperatures of 800° C. or higher, providing significantly higher IR emission.

In some embodiments, the infrared radiating membrane contains a thermoresistive film that comprises Silicon, Carbon, Molybdenum, Tantalum, or other refractory metals, and Oxygen as components. The thermoresistive film may be sandwiched between dielectric films in a multilayered structure, comprising low stressed LPVCD deposited silicon nitride, silicon oxynitride or silicon dioxide.

The energy source is mounted in a conventional case, e.g., a transistor case, or surface mounted, with integral reflective parabolic optic to provide a collimated energy beam over the entire MIR wavelength range.

This spectrometer design operates with a single MEMS IR emitter, in contrast with LVF-based MIR instruments that require an expensive array of emitters in order to properly collimate the optical emission across the LVF. This is a significant cost advantage for the present design.

The spectrometer design includes a unique, micro-structured attenuated total reflection silicon crystal plate (ATR) 120. This plate 120 is an inexpensive sample plate, which can be disposable, and onto which the sample (e.g., liquid, dried films or solid) is applied. In one embodiment, the present design uses a mechanical arrangement that uses a thin ruggedly antireflection coated Silicon window in the spectrometer enclosure so that an inert gas can be maintained inside the spectrometer to reduce local background absorption. When a Si ATR plate is used, it can be inserted into the spectrometer and spring-loaded onto or near this window for measurement. This configuration allows for sealing the spectrometer optical train and filling with inert gas to reduce water vapor and $CO_2$ absorption lines in the spectrum. Embodiments of this invention allow for a transmission cell for sampling with one reflective surface, or a flow cell for in-line measurement.

Microstructured Si ATR methods have been shown to provide enhancements in sample absorption of a factor of 2 to 4 compared to typical absorption schemes. Although a conventional commercially available Si ATR can be used with this present design, a specially designed signal-enhanced Si ATR plate that has been shown to provide a signal/noise enhancement of a factor of 10 to 18 compared to a standard diamond ATR can be used for greater sensitivity. Etched structures with dimensions smaller than the mid-IR wavelengths are required on the sample side of the plate to achieve this enhancement. The enhanced ATR plate can achieve much higher performance than a standard grating instrument in the MIR.

The structure on the sample side of the enhanced Si ATR plates has been shown to be able to separate plasma/serum from whole blood as effective as centrifuging, opening entirely new avenues for quick and low-cost whole blood analysis. In one example, the Si ATR plate is based on a double-side-polished (100) silicon substrate or wafer with v-shaped grooves of f111g facets on their backside. These facets are formed by crystal-oriented anisotropic wet etching within a conventional wafer structuring process. In an example, a typical wafer thickness may be 0.5 mm. These facets are used to couple infrared radiation into and out of the plate. In contrast to the application of the commonly used silicon multiple-internal reflection elements, these elements provide single-reflection ATR measurement at the sample side in the collimated beam. Due to the short light path within the ATR, absorption in the silicon allows coverage of the entire mid-infrared region with a high optical throughput, including the range of silicon lattice vibrations from $300$ cm$^{-1}$ to $1500$ cm$^{-1}$.

In addition to typical ATR applications, i.e., the measurement of bulk liquids and soft materials, the application of this ATR plate to the present design serves three purposes: 1) enhance the sputum spectral absorption, 2) provide an inexpensive disposable that is convenient for sample application, and 3) present a sufficiently rugged surface that will withstand patient handling.

Figure 2:
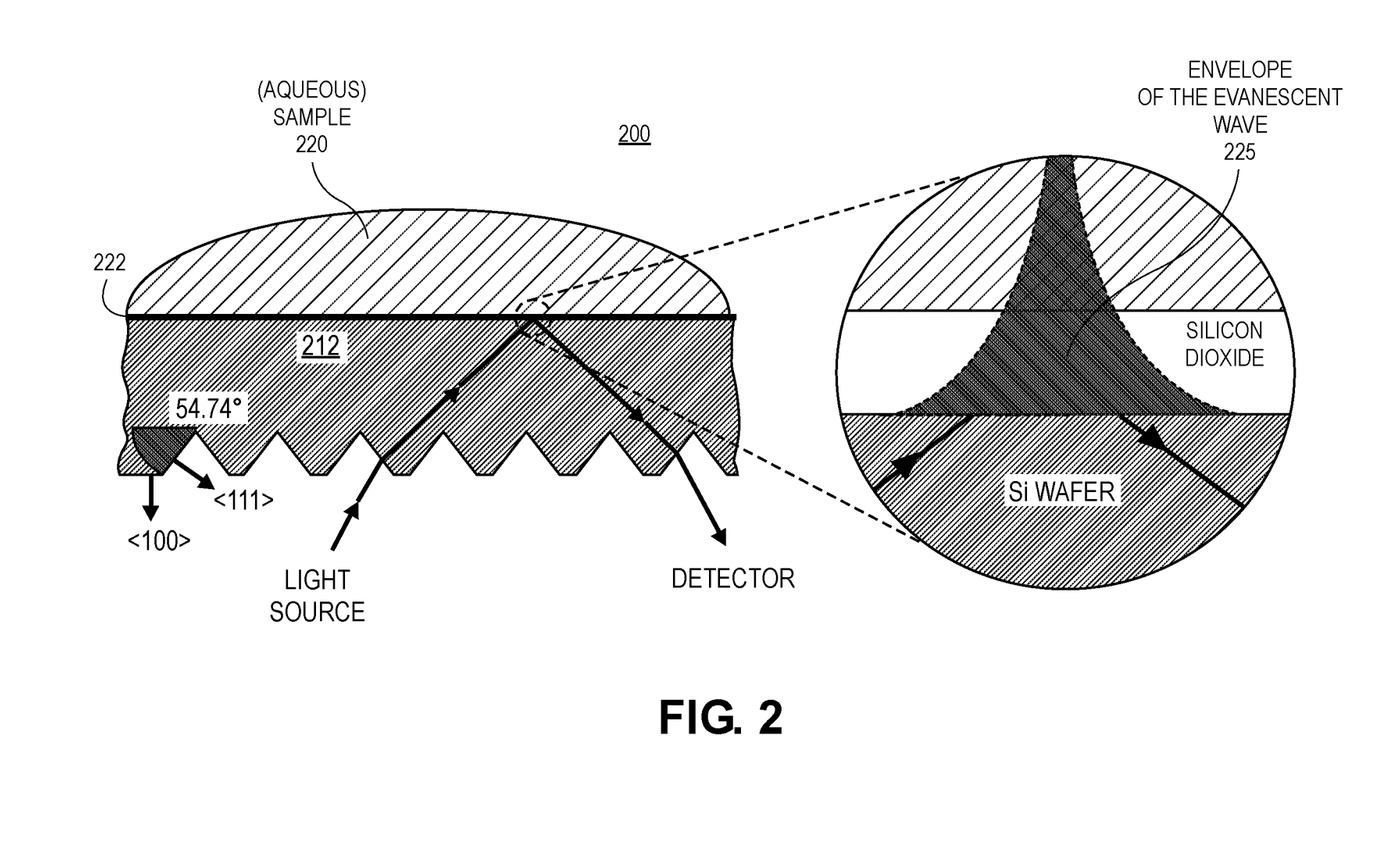
FIG. 2 illustrates an optical path with respect to a Si ATR plate having a sample in accordance with one embodiment.

An illustration of the optical path of this ATR plate is shown in FIG. 2 in accordance with one embodiment. Light from a light source enters the ATR plate 212 at a specific fixed angle of incidence, is refracted to a front sample surface 222 of sample 220 (e.g., aqueous sample 220), creates an evanescent wave 225 which penetrates the sample 220 at a certain depth (e.g., between 0.5 and 2 μm), then is refracted by the Si ATR plate 212 where it exits the ATR at the input angle of incidence.

IR radiation containing the absorption information (e.g., fundamental vibration mode of each molecule from the sample, how much of each wavelength of light is absorbed by different molecules) exits the sample plate and is directed to the scanning grating (e.g., grating 130) at or near the blaze angle, onto a replicated off-axis parabolic surface (e.g., off-axis parabola 150), and finally falls on a single thermopile detector (e.g., thermal detector 140). A blaze angle is chosen such that diffraction angle and incidence angle are identical. A scanning high-efficiency infrared spectral grating with self-calibrating feature, is configured so that incident energy having absorption information for the spectral absorption process of a sample is within a predefined threshold (e.g., +/−15%, +/−10%) of the grating blaze angle. This arrangement differs from a standard grating spectrometer in the application of the MEMS emitter, use of the disposable Si ATR sample plate, and provision of a miniature precision grating scanner with optimized grating.

In one example, as a disposable, this Si enhanced ATR is estimated to cost $1.75-$2.25, depending on quantity. In high volume, >1 million, the cost will be below $1.00.

In one embodiment, a high-efficiency IR Grating (e.g., grating 130) has an optimum grating groove density of 150 lines/mm, blaze angle of 37±2°, and a gold coating for all applications. The grating can be scanned using a micro miniature stepping motor with fine precision leadscrew in a miniature sine-drive arrangement. In one example, the grating is pivoted on two preloaded polished borosilicate balls for bearings, resulting in a smooth and repeatable scan to the required accuracy over the entire spectral range.

The present design includes a detection scheme for low cost and required resolution. To address minimal manufactured cost and still maintain a reasonable measurement time (e.g., estimated at less than 60 seconds total], a single uncooled thermopile detector (e.g., detector 140) is preferred. A pyroelectric detector or other type can also be utilized. Zemax® optical analysis shows that a resolution of $24$ cm$^{-1}$ is achieved with a single 0.5 mm diameter detector element in the system's focal plane, but smaller detectors can be implemented for resolution down to $12$ cm$^{-1}$.

The use of a single thermopile detector is critical to achieving the much lower manufacturing cost for the spectrometer compared with the LVF designs which rely on expensive pyroelectric detector arrays of 128 to 256 pixels.

The severe cost constraint imposed by the desire to provide a low-cost measurement solution for MIR absorption spectra represents a significant challenge to maintain sufficient sensitivity and resolution while performing the measurement of a sample in a reasonable period of time. This necessitates the use of an off-axis parabola reflector 150 for the final focusing optic, and the mid-IR wavelengths involved permits a replicated optic. This approach reduces cost for this component and opens the possibility to fabricate the parabolic surface along with the injection-molded subframe for further cost reduction.

Figure 3:
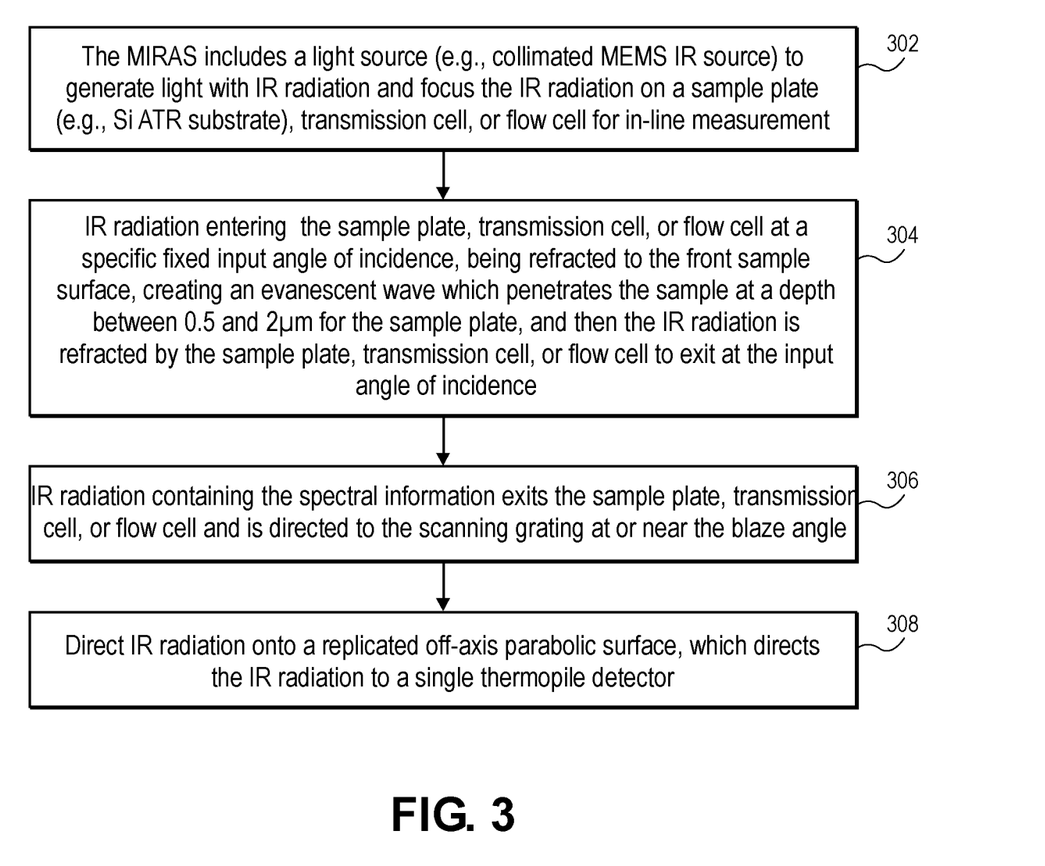
FIG. 3 illustrates a method 300 that may be executed by a mid-infrared absorption spectrometer system (MIRAS) of a handheld device in accordance with one embodiment.

In one embodiment, the present design includes a method for measuring a fundamental mode vibrational spectrum of materials and substances in the Mid-IR spectral range of 2.5 μm to 14 μm wavelength in accordance with one embodiment. FIG. 3 illustrates a method 300 that may be executed by a mid-infrared absorption spectrometer system (MIRAS) of a handheld device in accordance with one embodiment.

At operation 302, the MIRAS includes a light source (e.g., collimated MEMS IR source) to generate light with IR radiation and focus the IR radiation on a sample plate (e.g., Si ATR substrate, transmission cell, or flow cell) for in-line measurement. The light source may be electrically pulsed and emit electromagnetic radiation in the wavelength range from 2.5 μm to 14 μm and includes an integral energy concentrating optic to provide energy for a spectral absorption process.

In one example, the method includes IR radiation entering the sample plate (e.g., Si ATR substrate), transmission cell, or flow cell at a specific fixed input angle of incidence, being refracted to the front sample surface, creating an evanescent wave which penetrates the sample at a depth between 0.5 and 2 μm for the sample plate, and then the IR radiation is refracted by the sample plate (e.g., Si ATR substrate), transmission cell, or flow cell to exit at the input angle of incidence at operation 304.

The IR radiation containing the spectral information exits the sample plate, transmission cell, or flow cell and is directed to the scanning grating at or near the blaze angle at operation 306, and then is directed onto a replicated off-axis parabolic surface, which directs the IR radiation to a single thermopile detector at operation 308.

In one example, the basic spectrometer design utilizes a silicon ATR crystal for material absorption measurements. The design also is applicable for transmission absorption measurements with the addition of a cell with reflective outside surface in place of the ATR crystal. Also, adding a flow cell at the ATR location allows continuous process monitoring with this design.

The present design can be used for industrial oil, gas, alcohol, and other materials production process monitoring. Also, the present design can be used for monitoring of patients for medical conditions, both on the physician's office and point-of-care at the patient's side. Accurate measurements and optimization of growing process conditions for cannabinoids, both on-site and in the supply chain will benefit from the present design. Additional applications include detection of fake drugs, adulteration of food and food purity by measuring the presence of pathogens.

In one example, the present design provides automated sample analysis process with simple indication of spectrum and analysis.

In one example, the present design provides uncomplicated method(s) for obtaining samples for medical analysis.

In another example, the present design provides simple methods for insertion of a sample on disposable Silicon ATR plate.

In another example, the present design provides software to automate the spectrometer measurement process and interface, and spectrometer data can be output wirelessly to medical facilities, for example.

Generally, medical diagnostic testing validates clinical recommendations for treatment, especially for diseases where onset of critical patient conditions is likely to result in rapidly declining health. For example, there are an estimated greater than 300 million patients worldwide suffering from chronic obstructive pulmonary disease (COPD), where early detection of infective/inflammatory exacerbations can not only help prevent expensive hospital visits, but also can retard the rapid decline in lung condition if these exacerbations are detected pre-symptom. The diagnostic tests will also lead to significant improvement in quality of life, so that such a diagnostic method will gain widespread acceptance in the marketplace. Regular (e.g., several times per week) Mid-IR spectroscopic analysis of dried sputum films has been shown to be able to detect exacerbations from 5 up to 15 days ahead of the point where the patient him or herself starts to feel the onset of exacerbation, ample time for intervention by healthcare professionals with medication to avoid, or dramatically reduce the severity of the exacerbation, thereby avoiding hospitalization and resulting in improved outcome for the patient.

Preliminary results at the University of Swansea has also demonstrated the ability of mid-IR analysis of sputum samples to provide early diagnosis of Cystic Fibrosis and lung cancer. An essential requirement for widespread adoption of POC testing directly at the COPD patient's side is that the diagnostic instrument be inexpensive, handheld, simple to use, and able to share its diagnostics wirelessly with physicians or their assistants so that an early treatment modification/plan can be quickly prescribed and implemented.

The low cost of the mid-IR spectrometer of the present design allows the use of miniature, handheld spectrometers as a point-of-care (POC) instrument with connection to Cloud-based databases and telemedicine connection to medical personnel to direct and supervise treatment. This means the spectrometer must be sold for a few hundred US dollars, rather than the $7,000 to $10,000 price range of current mid-IR miniaturized spectrometers where low prices are not possible due to inherent costly design and components.

Figure 4:
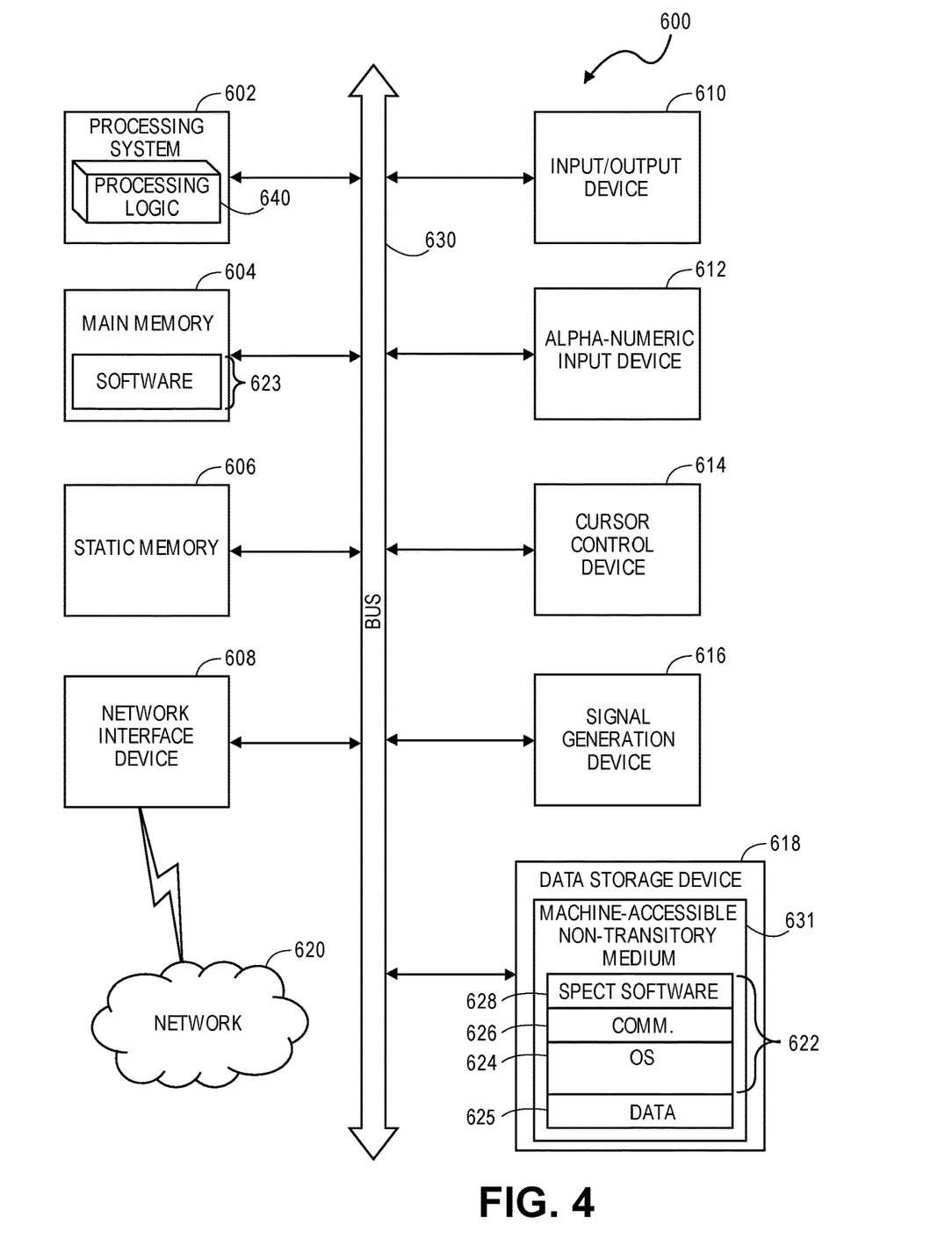
FIG. 4 illustrates a diagrammatic representation of a machine in the exemplary form of a computer system or device 600 within which a set of instructions, for causing the machine to perform any one or more of the methodologies discussed herein, may be executed.

FIG. 4 illustrates a diagrammatic representation of a machine in the exemplary form of a computer system or device 600 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a mobile device, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The electronic detector and control module comprises an electronics circuit board and computer system for corrections, storage, and analysis of measurements to identify and quantify substances in the spectral range of 2.5 µm to 14 µm. The electronic detector and control module are configured to execute instructions (e.g., software 623) to perform algorithms (e.g., FFT) and analysis to determine at least one of specific substances detected and their quantity. The electronic detector and control module can be integrated with the spectrometer system 100 or a separate computer system. The electronic detector and control module are configured to collect data (e.g., data 625) and to transmit the data directly to a remote location connected to network 620. A network interface device 608 transmits the data to the network 620. The data collected by the electronic detector and control module can be stored in data storage device 618 and also in a remote location for retrieval.

Processing system 602 represents one or more general-purpose processing devices such as a microprocessor, central processing unit, or the like. More particularly, the processing system 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing system 602 may also be one or more special-purpose processing devices such as an application specific integrated circuit (ASIC), a field programmable gate array (FPGA), a digital signal processor (DSP), network processor, or the like. The processing system 602 is configured to execute the processing logic 640 for performing the operations and steps discussed herein.

The device 600 may further include a network interface device 608. The device 600 also may include an input/output device 610 or display (e.g., a liquid crystal display (LCD), a plasma display, a cathode ray tube (CRT), or touch screen for receiving user input and displaying output), an optional alphanumeric input device 612 (e.g., a keyboard), an optional cursor control device 614 (e.g., a mouse), and a signal generation device 616 (e.g., a speaker).

The data storage device 618 may include a machine-accessible non-transitory medium 631 on which is stored one or more sets of instructions (e.g., software 622) embodying any one or more of the methodologies or functions described herein. The software 622 may include an operating system 624, spectrometer software 628, and communications module 626. The software 622 may also reside, completely or at least partially, within the main memory 604 (e.g., software 623) and/or within the processing system 602 during execution thereof by the device 600, the main memory 604 and the processing system 602 also constituting machine-accessible storage media. The software 622 or 623 may further be transmitted or received over a network 620 via the network interface device 608.

The machine-accessible non-transitory medium 631 may also be used to store data 625 for measurements and analysis of the data for the spectrometer system. Data may also be stored in other sections of device 600, such as static memory 606.

In one embodiment, a machine-accessible non-transitory medium contains executable computer program instructions which when executed by a data processing system cause the system to perform any of the methods discussed herein.
[0059] In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A Mid-infrared absorption spectrometer (MIRAS) system comprising:
    an infrared Micro-Electro-Mechanical System (MEMS) single element emitter light source, wherein the light source is electrically pulsed and emits electromagnetic radiation in the wavelength range from 2.5 µm to 14 µm and includes an integral energy concentrating optic to provide energy for a spectral absorption process;
    a miniature scanning infrared spectral grating that is scanned with a stepping motor and configured so that incident energy having absorption information for the spectral absorption process of a sample is directed from the sample to the miniature scanning infrared spectral grating within a predefined threshold of a grating blaze angle; and
    a single-element thermal detector to receive output energy having the absorption information from the infrared spectral grating.

2. The MIRAS system of claim 1, further comprising:
   a micro-machined silicon Attenuated Total Reflection (ATR) sample plate, either as stationary or removable and disposable is utilized.

3. The MIRAS system of claim 2, wherein the micro-machined silicon ATR sample plate is enhanced with etched structures having dimensions smaller than mid-IR wavelengths to increase absorption from the sample.

4. The MIRAS system of claim 1, further comprising:
   an off-axis parabolic reflector to concentrate at least 80% of the spectral portion of the output energy of the infrared spectral grating onto the single-element thermal detector.

5. The MIRAS system of claim 1, wherein the sample is contained in a reflection cell with one side reflectively coated.

6. The MIRAS system of claim 1, wherein the sample is observed using a flow cell with or without a Silicon attenuated total reflection (ATR) window.

7. The MIRAS system of claim 1, wherein the light source is a compact infrared emitter, wherein the MIRAS system is a compact handheld device.

8. The MIRAS system of claim 1, wherein the ATR is contained in an external holder which is either disposable or non-disposable.

9. The MIRAS system of claim 1, wherein a spectral resolution of the MIRAS system is set by at least one of the detector size and by the scanning grating minimum resolution that is set by a drive mechanism of the miniature scanning infrared spectral grating.

10. The MIRAS system of claim 1, wherein the MIRAS system is configured with temperature-control.

11. The MIRAS system of claim 1, further comprising:
    an electronic detector and control module that comprises an electronics circuit board and computer system for corrections, storage, and analysis of measurements to identify and quantify substances in the spectral range of 2.5 µm to 14 µm.

12. The MIRAS system of claim 11, wherein the electronic detector and control module are configured to execute instructions to perform algorithms and analysis to determine at least one of specific substances detected and their quantity.

13. The MIRAS system of claim 1, wherein the predefined threshold is a range of plus or minus 15% of a grating blaze angle.

14. The MIRAS system of claim 1, further comprising:
    an antireflection coated Silicon window within a spectrometer enclosure so that an inert gas to be maintained inside the spectrometer to reduce local background absorption.

15. A method for measuring a fundamental mode vibrational spectrum of materials and substances in the Mid-IR spectral range of 2.5 µm to 14 µm wavelength, the method comprising:
    generating light with IR radiation and focusing the IR radiation at a specific fixed input angle of incidence on a sample plate;
    refracting the IR radiation to a front surface of the sample, creating an evanescent wave which penetrates the sample, and then IR radiation is refracted by the sample plate to exit at the input angle of incidence; and
    directing the IR radiation containing absorption information for a spectral absorption process from the sample to a miniature scanning infrared spectral grating that is scanned with a stepping motor and configured to receive the IR radiation at or near a blaze angle, with the spectral grating directing the IR radiation onto an off-axis parabolic surface.

16. The method of claim 15, further comprising:
    directing the IR radiation having the absorption information from the off-axis parabolic surface to a single thermopile detector.

17. The method of claim 15, wherein the light source is electrically pulsed and emits electromagnetic IR radiation in a wavelength range from 2.5 µm to 14 µm and includes an integral energy concentrating optic to provide energy for a spectral absorption process.

18. A handheld spectrometer device to perform a spectral absorption process, the handheld spectrometer device comprising:
    an infrared Micro-Electro-Mechanical System (MEMS) single element emitter light source, wherein the light source emits electromagnetic radiation in the wavelength range from 2.5 µm to 14 µm and includes an integral energy concentrating optic to provide energy for the spectral absorption process; and
    a miniature scanning infrared spectral grating, that is scanned with a stepping motor and configured so that incident energy having absorption information for the spectral absorption process of a sample is directed from the sample to the miniature scanning infrared spectral grating within a predefined threshold of a grating blaze angle.

19. The handheld spectrometer device of claim 18 further comprising:
a single-element thermal detector to receive output energy having the absorption information from the infrared spectral grating; and
a micro-machined silicon Attenuated Total Reflection (ATR) sample plate to hold the sample, either as stationary or removable.

* * * * *